(12) United States Patent
Bisanti et al.

(10) Patent No.: US 7,653,370 B2
(45) Date of Patent: Jan. 26, 2010

(54) OFFSET SIGNAL PHASING FOR A MULTIPLE FREQUENCY SOURCE SYSTEM

(75) Inventors: Biagio Bisanti, Antibes (FR); Stefano Cipriani, Golfe Juan (FR); Lorenzo Carpineto, Antibes (FR); Gianni Puccio, La Gaude (FR); Eric Duvivier, Golfe Juan (FR); Francesco Coppola, Grasse (FR); Martin Alderton, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 502 days.

(21) Appl. No.: 11/461,533

(22) Filed: Aug. 1, 2006

(65) Prior Publication Data

US 2007/0176663 A1 Aug. 2, 2007

Related U.S. Application Data

(60) Provisional application No. 60/595,749, filed on Aug. 2, 2005, provisional application No. 60/595,750, filed on Aug. 2, 2005, provisional application No. 60/595,754, filed on Aug. 2, 2005.

(51) Int. Cl.
*H04B 1/06* (2006.01)
(52) U.S. Cl. .................. 455/255; 455/256; 455/258; 327/291; 327/295; 327/296
(58) Field of Classification Search ............. 455/139, 455/424, 425, 456.5, 456.6, 561, 550.1, 575.1, 455/265, 318, 208; 327/159, 149, 150, 152, 327/158, 161, 231–235; 331/12, 17, 25, 331/27
See application file for complete search history.

(56) References Cited

U.S. PATENT DOCUMENTS 5,452,290 A 9/1995 Mihm (Continued)

FOREIGN PATENT DOCUMENTS

EP 1 045 606 10/2000

(Continued)

OTHER PUBLICATIONS

Vuillod P. et al: "Clock-Skew Optimization for Peak Current Reduction," ISLPED, Proc. of the Int'l Symposium on Low Power Electronics and Design, Aug. 14, 1996, pp. 265-270.

(Continued)

*Primary Examiner*—Duc Nguyen
*Assistant Examiner*—Charles Chow
(74) *Attorney, Agent, or Firm*—Clifford Perry; Bruce W. Greenhaus

(57) ABSTRACT

A tunable multiple frequency source system employing offset signal phasing includes a first frequency source, a phase delay element, and a second frequency source configured to operate concurrently with the first frequency source. The first frequency source includes an input coupled to receive a reference input signal and an output for providing a first frequency source signal. The phase delay includes an input coupled to receive the input reference signal, and an output, the phase delay element operable to apply a predefined phase delay to the input reference signal to produce a phase-delayed input signal. The second frequency source includes an input coupled to receive the phase-delayed input signal and an output for providing a second frequency source signal.

27 Claims, 5 Drawing Sheets

U.S. PATENT DOCUMENTS

| | | | |
|---|---|---|---|
| 5,565,816 A | | 10/1996 | Coeteus |
| 5,774,701 A | * | 6/1998 | Matsui et al. ............... 713/501 |
| 6,005,420 A | * | 12/1999 | Yoshizawa et al. .......... 327/116 |
| 6,112,308 A | * | 8/2000 | Self et al. .................... 713/400 |
| 6,147,561 A | * | 11/2000 | Rhee et al. ..................... 331/12 |
| 6,177,964 B1 | * | 1/2001 | Birleson et al. .............. 348/725 |
| 6,226,537 B1 | * | 5/2001 | Namura et al. ............... 455/574 |
| 6,275,990 B1 | | 8/2001 | Dapper et al. |
| 6,304,146 B1 | | 10/2001 | Welland |
| 6,686,803 B1 | * | 2/2004 | Perrott et al. .................. 331/10 |
| 7,062,229 B2 | * | 6/2006 | Dunworth et al. .............. 455/76 |
| 7,216,249 B2 | | 5/2007 | Fujiwara et al. |
| 7,339,078 B2 | * | 3/2008 | Getman et al. ................ 564/92 |
| 2003/0006850 A1 | | 1/2003 | Lye et al. |
| 2003/0076184 A1 | * | 4/2003 | Oita ............................ 331/176 |
| 2003/0109242 A1 | * | 6/2003 | Ohtaki ....................... 455/335 |
| 2003/0179842 A1 | * | 9/2003 | Kane et al. ................... 375/376 |
| 2004/0012447 A1 | * | 1/2004 | Nagaishi et al. ................ 331/2 |
| 2004/0156465 A1 | | 8/2004 | Schmandt |
| 2004/0189366 A1 | | 9/2004 | Haringer et al. |
| 2006/0153323 A1 | * | 7/2006 | Kataoka et al. ............. 375/354 |

FOREIGN PATENT DOCUMENTS

| | | | |
|---|---|---|---|
| JP | 07-007386 | | 10/1995 |
| JP | 09-246967 | * | 9/1997 |
| WO | WO 99/41933 | | 8/1999 |
| WO | WO 2004/000822 | | 9/2004 |

OTHER PUBLICATIONS

Neves et al. "Buffered Clock Tree Synthesis with Non-Zero Clock Skew Scheduling for Increased Tolerance to Process Parameter Variations," J. of VLSI Signal Proc. Systems for Signal, vol. 16, No. 2/3, Jun. 1997 pp. 149-160.

Courtesy International Search Report for PCT/IB2006/052632 dated Dec. 22, 2006.

Courtesy International Search Report for PCT/IB2006/052633 dated Dec. 22, 2006.

Courtesy International Search Report for PCT/IB2006/052634 dated Jan. 12, 2007.

* cited by examiner

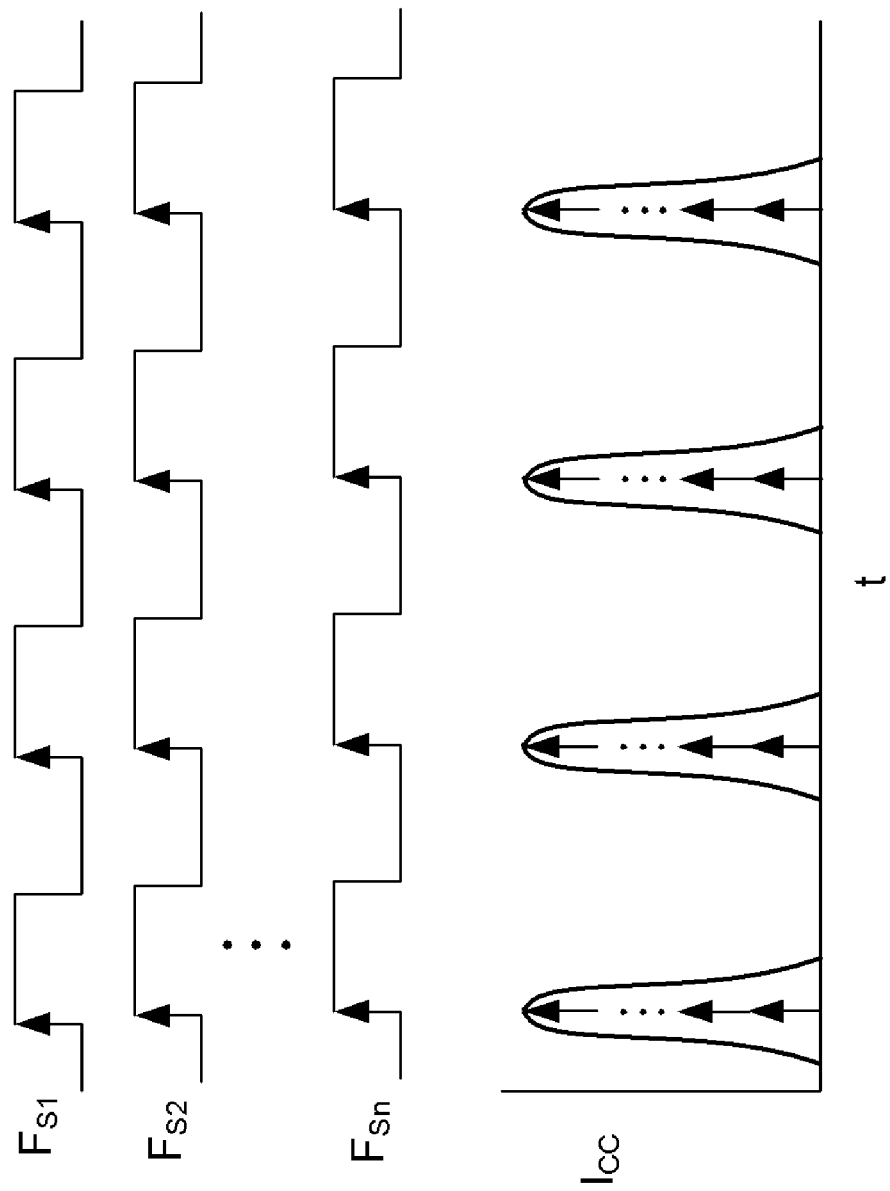

OFFSET SIGNAL PHASING FOR A MULTIPLE FREQUENCY SOURCE SYSTEM

CROSS REFERENCE TO RELATED APPLICATIONS

This patent application is related to, and concurrently filed with each of the following patent applications, the contents of which are herein incorporated by reference for all purposes:

"Multiple Frequency Source System and Method of Operation," application Ser. No. 11/461,530, and "System and Method for Mitigating Phase Pulling in a Multiple Frequency Source System," application Ser. No. 11/461,534.

This patent application claims priority to, and incorporates in its entirety each of the following US patent applications:

"Multiple Frequency Source System and Method of Operation," Application Ser. No. 60/595,754, filed Aug. 2, 2005;

"Offset Signal Phasing for a Multiple Frequency Source System," Application Ser. No. 60/595,749, filed Aug. 2, 2005; and "System and Method for Mitigating Phase Pulling in a Multiple Frequency Source System," Application Ser. No. 60/595,750, filed Aug. 2, 2005.

BACKGROUND

The present invention relates to tunable systems employing concurrently operable frequency sources, and in particular to offset signal phasing for use with said system.

The implementation of multiple frequency sources in a system, as described in the application entitled "Multiple Frequency Source System and Method of Operation," presents possible challenges in how to control the system's power consumption. Specifically, the operation of multiple frequency sources may create a high peak current demand from the power supply, possibly resulting in a drop in the power supply voltage to a level which may be insufficient to continue reliable system operation.

What is therefore needed is a system and method for avoiding high peak current consumption in a system employing multiple frequency sources.

SUMMARY

Systems and methods are presented herein for avoiding high peak power (current or voltage) consumption in a multiple frequency source system through the use of phase delays to stagger the application of input signals to respective frequency sources.

In an exemplary embodiment, the multiple frequency source system includes a first operating frequency source, a phase delay element, and a second operating frequency source configured to operate concurrently with the first frequency source. The first frequency source includes an input coupled to receive a reference input signal and an output for providing a first frequency source signal. The phase delay includes an input coupled to receive the input reference signal, and an output, the phase delay element operable to apply a predefined phase delay to the input reference signal to produce a phase-delayed input signal. The second frequency source includes an input coupled to receive the phase-delayed input signal and an output for providing a second frequency source signal.

These and other features of the invention will be better understood when viewed in light of the following detailed description and drawings.

BRIEF DESCRIPTION OF THE DRAWINGS

FIG. 1B illustrates time domain signal waveforms and peak current consumption for the tunable multiple frequency source system of FIG. 1A.

For clarity, previously identified features retain their reference indicia in subsequent drawings.

DESCRIPTION OF EXEMPLARY EMBODIMENTS

Figure 1A:
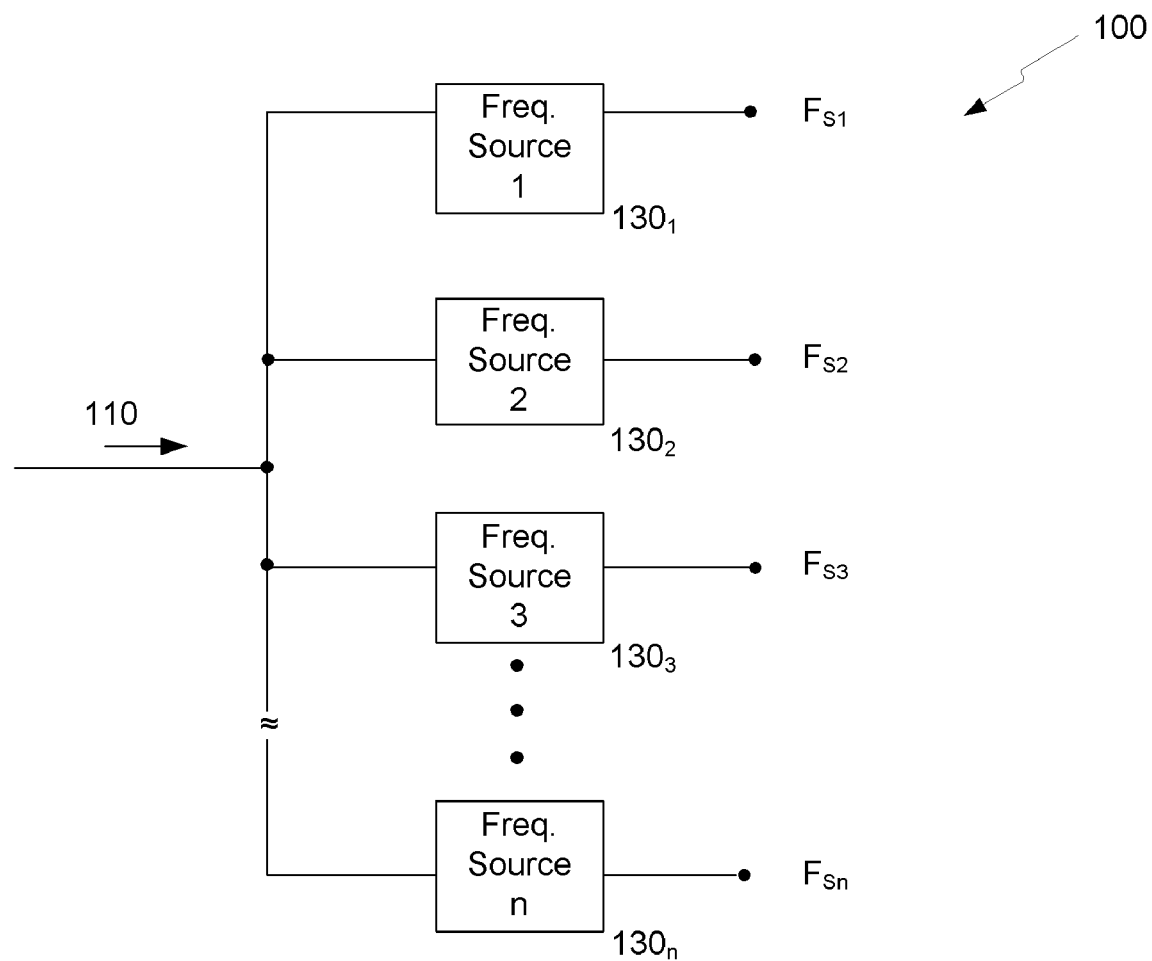
FIG. 1A illustrates a tunable system employing multiple frequency sources, whereby the operating frequency sources are operating coherently.

FIG. 1A illustrates a tunable system employing concurrently operating frequency sources ("tunable multiple frequency source"), whereby the operating frequency sources are operating in a high current mode coherently. The system 100 includes n frequency sources $130_{1,n}$, which in a particular embodiment, includes at least one tunable source, such a variable frequency oscillator or phase locked loop. One or more of the remaining frequency sources may be tunable or fixed frequency sources.

During operation, the system receives an input signal 110 which is supplied to two or more (all, as illustrated) of the operating frequency sources $130_{1,n}$. The input signal 110 is operable to initiate a high current mode of operation, which may comprise activating the frequency source to generate an output signal $F_{S1,n}$. In exemplary embodiments, the input signal 110 may be a clock signal, a reference signal, or other such signal operable to activate the frequency sources, or to otherwise produce a high current mode of operation such that the frequency source begins to draw a significant amount of current (e.g., more than 50 percent of its maximum current handling capacity).

FIG. 1B illustrates time domain signal waveforms and peak current consumption for the tunable multiple frequency source system of FIG. 1A. As shown, multiple frequency sources are activated, and accordingly, enter into a high current mode of operation substantially concurrently. As a result, the power supply bus is subjected to very high current supply spikes. This condition creates undesired effects, in that the power supply may not have sufficient capacity to supply the high peak current needed during these periods, resulting in a drop in the supply voltage to a level which may not be sufficient to continue reliable system operation. Furthermore, the generation of the high current spikes in the time domain is accompanied by a large number of spurious products in the frequency domain. The presence of a large number of spurious products on the power supply bus is especially problematic, as the power supply bus structure provides a signal path to each of the frequency sources $130_{1,n}$, where the spurs can combine with desired output signals $F_{S1,n}$ to degrade the phase noise of the intended output signals $F_{S1,n}$.

Figure 2A:
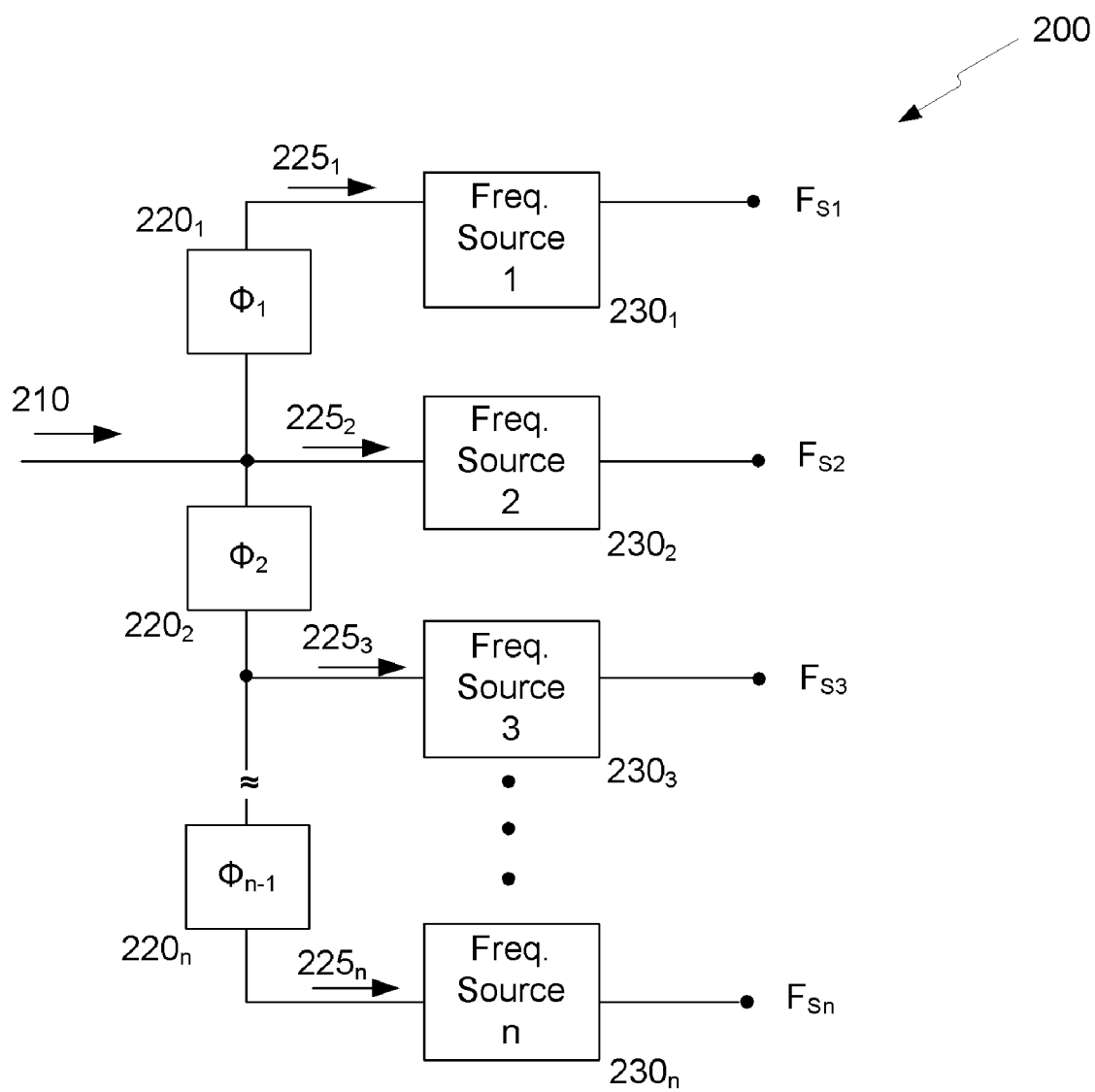
FIG. 2A illustrates an exemplary multiple frequency source system employing offset signal phasing in accordance with the present invention.

FIG. 2A illustrates an exemplary tunable multiple frequency source system employing offset signal phasing in accordance with the present invention. The system includes n frequency sources $230_{1,n}$ operable to generate n corresponding frequency source signals $F_{Sn}$, and n−1 phase delay elements $220_{1,(n-1)}$. An input signal 210 is operable to activate, or otherwise cause the coupled frequency sources $230_{1,n}$ to enter into a high current mode.

As shown, the n−1 phase delay elements $220_{1,n}$ are interposed between adjacent frequency sources, wherein one of the frequency sources (illustrated as frequency source 2, $230_2$) receives an undelayed version of the input signal 210 (referred to herein as the reference input signal) and operates as a reference frequency source. Each of the n−1 phase-delay elements 220 is operable to apply a particular predefined phase offset $\phi_{1,(n-1)}$ to the incoming signal, thereby producing n−1 delayed input signals 225. The calculation of the predefined phase offsets the calculation of which is further described below. By computing a phase offset and applying said offset to the frequency sources via the phase delay elements 220, current consumption of the frequency sources can be staggered, and the undesirable conditions of a drop in the power supply voltage or spurious product generation can be mitigated.

The phase delay may be provided electrically, i.e., through the use of a particular structure such as an inverter, or physically, through the implementation of a number of cascaded elements (e.g., inverters) that provides a time delay equivalent to the desired phase delay. The system 200 may be implemented in "ladder" type network arrangement in which the phase delay at the input of the nth frequency source $230_n$ is the sum of delay elements $220_2$ to $220_n$. Alternatively, a "star" type network may be employed in which each delay element 2201,2 receives the system input signal 210, and only one delay element is used to apply the desired delay prior to input to the corresponding frequency source 230. Further alternatively, the system may employ segments of both types of structures, as shown in the illustrated embodiment of FIG. 2A.

Figure 2B:
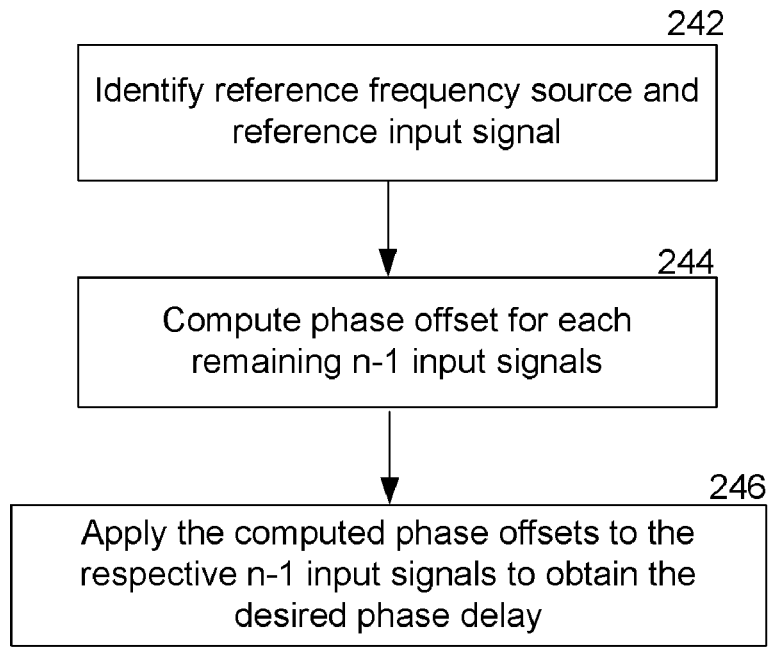
FIG. 2B illustrates an exemplary method for operating a multiple frequency source system in accordance within one embodiment of the present invention.

FIG. 2B illustrates an exemplary method for operating a tunable multiple frequency source system in accordance within one embodiment of the present invention. Initially at 262, a reference frequency source (e.g. source $230_2$) is identified from the plurality of frequency sources. The signal input into the reference frequency source is defined as having a relative phase offset of zero degrees in the following phase offset computation process.

At 264, the phase offsets for each of the remaining n−1 signals which are input into the corresponding n−1 frequency sources are computed. In one embodiment of this process, the reference signal, and the remaining n−1 input signals are spaced equally apart over a phase range provided by the calculation:

$$\frac{n-1}{n} \times 360 = \text{phase range} \qquad \text{eq. (1)}$$

where n is the number of concurrently operating frequency sources.

For example, in a system embodiment in which three frequency sources are implemented, the reference input signal is located at 0 degrees, and the first and second phase-delayed signals are located at 120 and 240 degrees phase.

In another embodiment, the reference input signal and the remaining n−1 phase-delayed signals are spaced equally apart over a 180 degree phase range. For example, in a system embodiment in which three frequency sources are implemented, the reference input signal is located at 0 degrees, and the first and second phase-delayed signals are located at 90 and 180 degrees phase.

At 266, the phase offsets computed for the respective n−1 input signals are applied to their corresponding input signals to provide the desired phase delay. In a particular embodiment of this process, one or more of the n−1 input signals are transmitted through an odd number (2n+1) of inverters cascaded to provide a 180 degree phase shift relative to an even number (2n) of cascaded inverters which may be used to provide the reference input signal. In a further embodiment, one or more of the n−1 input signals are transmitted through a cascaded string of circuit elements (e.g., inverters) operable to provide a physical time delay which provides the desired phase delay. A combination of these approaches may be used to provide the necessary phase delay elements, as further illustrated below.

Figure 2C:
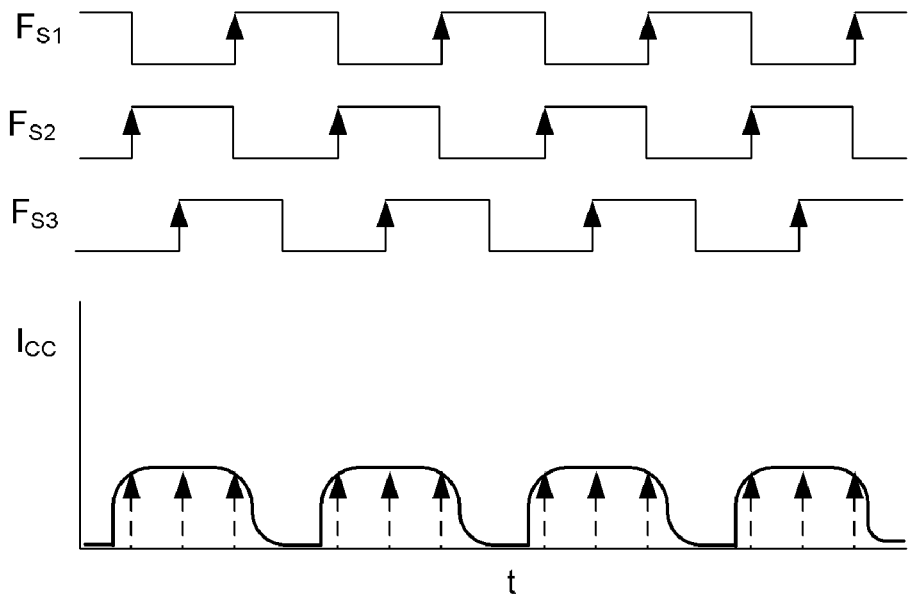
FIG. 2C illustrates time domain signal waveforms and peak current consumption for the system of FIG. 2A using the method of FIG. 2B

FIG. 2C illustrates time domain signal waveforms and peak current consumption for the system of FIG. 2A using the method of FIG. 2B. The responses are shown for a system consistent with FIG. 2A employing three concurrently operation frequency sources which provide output frequencies $F_{S0}$, $F_{S1}$ and $F_{S2}$, respectively. The system includes a first phase delay element $\phi 1$ which generates a 180 degree phase-shifted delayed input signal $225_1$, that signal $225_1$ being supplied to its corresponding frequency source $230_1$ to produce an output waveform $F_{S1}$. Further included is a second phase delay element $100_2$ which generates a 90 degree phase-shifted delayed input signal $225_2$, that signal $225_2$ being supplied to its corresponding frequency source $230_3$ to produce an output waveform $FS_3$.

As the time domain waveforms show, the rising edges of $F_{S1}$, $F_{S2}$, $F_{S3}$ are offset 90 degrees from each other. The offset phasing produces a distributed peak current response compared to the response in FIG. 1, resulting in reduced current peaking and less spurious product generation.

As noted above, one or more of the concurrently operating frequency source $230_{1,n}$ will be a tunable source, an example of which is a sigma-delta fractional phase locked loop circuit. The remaining frequency sources may be tunable or fixed frequency, as dictated by the design. In the particular embodiment in which the frequency source is a phase locked loop, the phase-delay element associated therewith may be located along the signal path supplying the loop's reference signal $F_{Ref}$.

Figure 3:
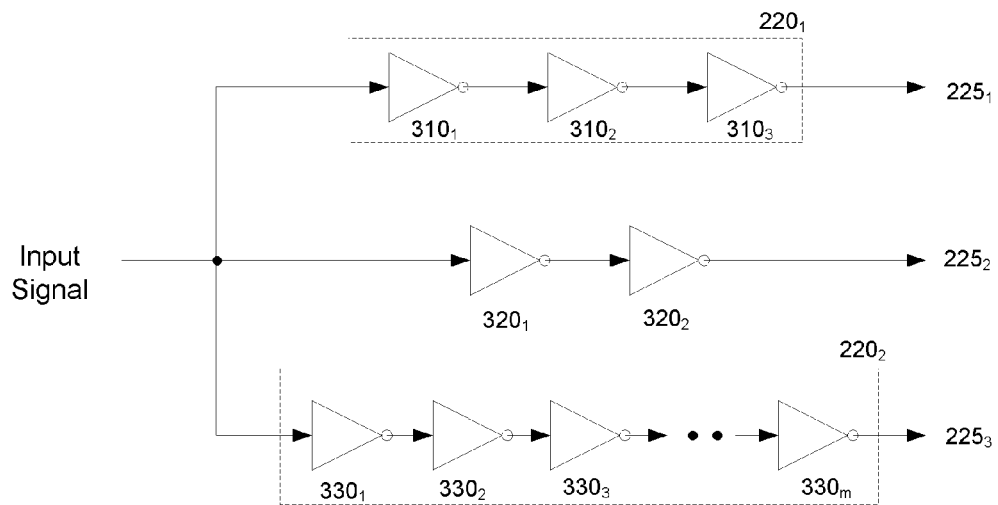
FIG. 3 illustrates an exemplary implementation of the phase delay elements used to provide offset signal phasing in the tunable multiple frequency source system of FIG. 2A.

FIG. 3 illustrates an exemplary implementation of the phase delay elements used to provide offset signal phasing in system of FIG. 2A. The phase delay element $\phi_1$ $220_1$ includes three inverter elements $310_1$, $310_2$ and $310_3$, this number representing one inverter more than the total number of inverter elements $320_1$ and $320_2$ provided for the reference input signal $225_2$. In this embodiment, the two inverter delay elements $310_1$ and $310_2$ are used to provide an input buffer to the input of the reference frequency source $230_2$ receiving the reference input signal $225_2$, and the additional inverter element $310_3$ supplied in the phase delay element $220_1$ provides a 180 degree phase relative to the reference input signal $225_2$. In an alternative embodiment, fewer inverter elements may be used (e.g., no inverters used for the reference input signal $225_2$ and one inverter element for producing the delayed input signal $225_1$), or more inverter elements may be used (e.g., 2n inverters used for generating the delayed input signal $225_1$, and 2n+1 inverters used for generating the reference input signal $225_2$).

Phase delay element $\phi_2$ $220_2$ is realized in a particular embodiment using multiple, series-coupled inverter elements $330_{1,m}$, the collective arrangement of which produces the desired time/phase delay. In one embodiment, the desired delay is substantially midway between the phasing of the existing reference and delayed input signals $225_1$ and $225_2$; for example in the above illustrated embodiment in which reference and delayed input signals $225_1$ and $225_2$ are located at 0 and 180 degree relative phasing, a sufficient number of inverter elements $330_{1,m}$ is cascaded to provide a time/phase delay substantially equivalent to 90 degrees of phase delay. For example, a cascaded arrangement of 150-200 inverter elements may be needed to provide the physical delay. As the inverter elements are quite small in size, have high associated yield, and are easily producible, a large number can be easily implemented within an integrated circuit without difficulty.

Figure 4:
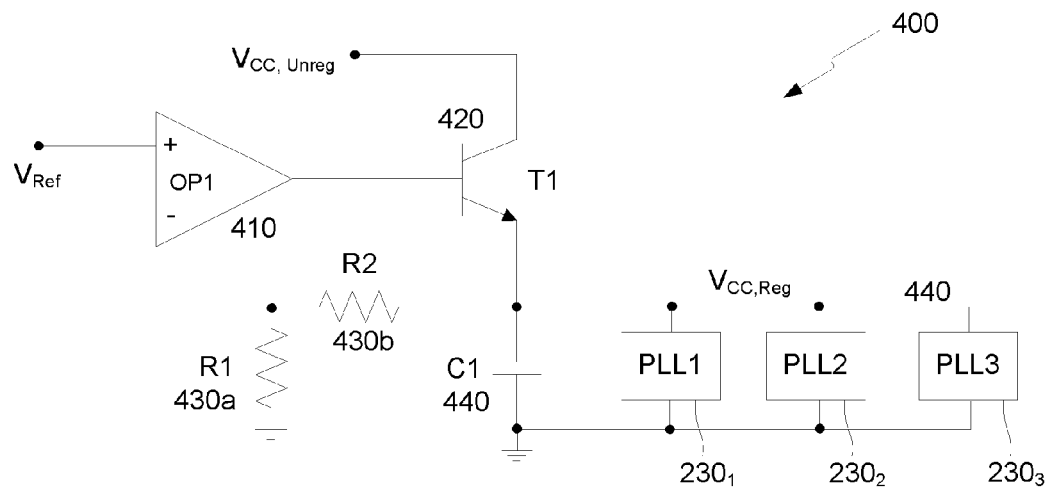
FIG. 4 illustrates an exemplary block diagram of a regulated power supply for use with the tunable multiple frequency source system of FIG. 3A.

FIG. 4 illustrates an exemplary block diagram of a regulated power supply ("regulator" herein) for the tunable multiple frequency source system of FIG. 3A. The regulator 400 includes an operation amplifier OP1 410, a transistor T1 420, feedback resistors R1 and R2 430, regulator capacitor C1 440, and a power supply bus 450. The operational amplifier 410 is connected in a conventional non-inverting amplifier configuration and includes a non-inverting input coupled to receive a reference voltage and a resistive divider formed by resistors 430a and 430b coupled to the inverting input. The regulator capacitor 440 is operable to filter out ac signals propagating along the power supply bus 450 and provides charge to the power supply bus 450 when supply transistor 420 is in a cutoff mode. Supply transistor 420 (exemplary illustrated as a bipolar junction transistor) includes a collector terminal coupled to the unregulated power supply, a base terminal coupled to the output of the operational amplifier 410, and an emitter terminal coupled to the power supply bus 450.

When the reference sources toggle, the supply transistor 420 and regulator capacitor 440 supplies the required current. Due to the limited bandwidth of the regulator (especially if it is providing a very low amount of DC current) the peak current is provided by the regulator capacitor 440 from the charge stored thereby, with a consequential drop of the regulated voltage. After the time delay dependent on the regulator bandwidth, the regulator restores the charge in the regulator capacitor 440, bringing the regulated voltage to steady state value. In the low current conduction, the lower value of the peak current supplied at higher frequency acts as low pass filtering of the peak current that needs to be supplied in high current mode. Consequently the voltage ripple on the regulated voltage is reduced.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The terms "a" or "an" are used to refer to one, or more than one feature described thereby. Furthermore, the term "coupled" or "connected" refers to features which are in communication with each other (electrically, mechanically, thermally, as the case may be), either directly, or via one or more intervening structures or substances. The sequence of operations and actions referred to in method flowcharts are exemplary, and the operations and actions may be conducted in a different sequence, as well as two or more of the operations and actions conducted concurrently. All publications, patents, and other documents referred to herein are incorporated by reference in their entirety. To the extent of any inconsistent usage between any such incorporated document and this document, usage in this document shall control.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A tunable system configured to employ multiple, concurrently-operable frequency sources operating in a high current mode of operation in which an input signal supplied to one or more of the multiple frequency sources is phase offset relative to an input signal supplied to one or more of the other frequency sources, the system comprising:
 a first frequency source having an input coupled to receive a reference input signal and an output for providing a first frequency source signal;
 a phase delay element having an input coupled to receive the input reference signal and an output, the phase delay element operable to apply a predefined phase delay to the input reference signal to produce a phase-delayed input signal; and
 a second frequency source configured to be concurrently operable with the first frequency source, the second frequency source having an input coupled to receive the phase-delayed input signal and an output for providing a second frequency source signal;
 wherein the phase difference between the reference input signal and the phase delayed input reference signal ensures a reduction in the peak current consumption by preventing the first and second frequency source from entering into a high current mode of operation substantially concurrently.

2. The system of claim 1, wherein the phase delay element comprises an inverter element, and wherein the first frequency source signal and the second frequency source signal are substantially 180 degrees out of phase.

3. The system of claim 1, wherein at least one of the first frequency source or the second frequency source comprises a phase locked loop circuit.

4. The system of claim 1, further comprising an even number of series-coupled inverters through which the reference input signal is coupled to the input of the first frequency source, and wherein the phase delay element comprises a set of inverters, the set including one more inverter than is included in the even number of inverters, the inverters of the phase delay element configured in a series-coupled arrangement.

5. The system of claim 1, wherein the phase delay element comprises a first phase delay element operable to apply a first predefined phase delay to the system input signal to produce a first phase-delayed input signal, the system further comprising:

a second phase delay element having an input coupled to receive the reference input signal, and an output, the second phase delay element operable to apply a second predefined phase delay to the input reference signal to produce a second phase-delayed input signal; and a third frequency source having an input coupled to receive the second phase-delayed input signal and an output for providing a third frequency source signal.

6. The system of claim 5, wherein the reference input signal is defined as operating at zero degrees phase reference, and wherein the first and second phase delay elements are operable to provide first and second phase offsets to produce respective first and second phase-delayed input signals, wherein the reference input signal, the first phase delayed input signal, and the second phase-delayed reference signal are equally spaced apart over a phase range provided by the equation:

$$\frac{n-1}{n} \times 360 = \text{phase range}$$

where n is the number of concurrently operating frequency sources.

7. The system of claim 6, wherein the first delay element comprises a first series coupled arrangement of inverter elements, wherein the total delay time of the first series coupled arrangement of inverter elements is substantially equivalent to the first phase offset.

8. The system of claim 7, wherein the second delay element comprises a second series-coupled arrangement of inverter elements, wherein the total delay time of the second series-coupled arrangement of inverter elements is substantially equivalent to the second phase offset.

9. The system of claim 5, wherein the reference input signal is defined as operating at zero degrees phase reference, and wherein the first and second phase delay elements are operable to provide first and second phase offsets to produce respective first and second phase-delayed input signals, wherein the reference input signal, the first phase delayed input signal, and the second phase-delayed input signal are equally spaced apart over a 180 degree phase range.

10. The system of claim 9, wherein the first delay element comprises a first series coupled arrangement of inverter elements, wherein the total delay time of the first series coupled arrangement of inverter elements is substantially equivalent to the first phase offset.

11. The system of claim 10, wherein the second delay element comprises a series coupled arrangement of an odd number of inverter elements, wherein reference input signal is generated by transmission through a series arrangement of inverter elements numbering one fewer than said odd number of inverter elements.

12. The system of claim 1, wherein the phase delay element comprises a first phase delay element operable to apply a first predefined phase delay to the input signal to produce a first phase-delayed input signal, the system further comprising:

a second phase delay element having an input coupled to receive the first delayed input signal, and an output, the second phase delay element operable to provide a second predefined phase delay to the supplied first phase-delayed input signal to produce a second phase-delayed input signal; and a third frequency source having an input coupled to receive the second phase delayed reference signal and an output for providing a third frequency source signal.

13. The multiple frequency source system of claim 12, wherein the reference input signal is defined as operating at zero degrees phase reference, and wherein the first and second phase delay elements are operable to provide first and second phase offsets to produce respective first and second phase-delayed input signals, wherein the reference input signal, the first phase-delayed input signal, and the second phase-delayed reference signal are equally spaced apart over a phase range defined by the equation:

$$\frac{n-1}{n} \times 360 = \text{phase range}$$

where n is the number of concurrently operating frequency sources.

14. The system of claim 12, wherein the reference input signal is defined as operating at zero degrees phase reference, and wherein the first and second phase delay elements are operable to provide first and second phase offsets to produce respective first and second phase-delayed input signals, wherein the reference input signal, the first phase delayed input signal, and the second phase-delayed input signal are equally spaced apart over a 180 degree phase range.

15. A tunable system configured to employ multiple, concurrently-operable frequency sources in which an input signal supplied to one or more of the multiple frequency sources is phase offset relative to an input signal supplied to one or more of the other frequency sources, the system comprising:

a first frequency source having an input coupled to receive a reference input signal and an output for providing a first frequency source signal;

a first phase delay element having an input coupled to receive the input reference signal and an output, the phase delay element operable to apply a first predefined phase delay to the input reference signal to produce a phase-delayed input signal;

a second frequency source configured to be concurrently operable with the first frequency source, the second frequency source having an input coupled to receive the first phase-delayed input signal and an output for providing a second frequency source signal;

a second phase delay element having an input coupled to receive the reference input signal, and an output, the second phase delay element operable to apply a second predefined phase delay to the input reference signal to produce a second phase-delayed input signal; and a third frequency source configured to be concurrently operable with the first and second frequency sources, the third frequency source having an input coupled to receive the second phase-delayed input signal and an output for providing a third frequency source signal;

wherein the phase relationship between the reference input signal, the first predefined phase delayed input reference signal and the second predefined phase delayed input reference signal ensures a reduction in the peak current consumption by preventing a plurality of the frequency sources from entering into a high current mode of operation substantially concurrently.

16. The system of claim 15, wherein the reference input signal is defined as operating at zero degrees phase reference, and wherein the first and second phase delay elements are operable to provide first and second phase-delayed input signals, wherein the reference input signal, the first phase delayed input signal, and the second phase-delayed reference signal are equally spaced apart over a phase range provided by the equation:

$$\frac{n-1}{n} \times 360 = \text{phase range}$$

where n is the number of concurrently operating frequency sources.

17. The system of claim 15, wherein the reference input signal is defined as operating at zero degrees phase reference, and wherein the first and second phase delay elements are operable to provide first and second phase offsets to produce respective first and second phase-delayed input signals, wherein the reference input signal, the first phase delayed input signal, and the second phase-delayed input signal are equally spaced apart over a 180 degree phase range.

18. The system of claim 17, wherein the first delay element comprises a first series coupled arrangement of inverter elements, wherein the total delay time of the first series coupled arrangement of inverter elements is substantially equivalent to the first phase offset.

19. The system of claim 18, wherein the second delay element comprises a series coupled arrangement of an odd number of inverter elements, wherein reference input signal is generated by transmission through a series arrangement of inverter elements numbering one fewer than said odd number of inverter elements.

20. In a tunable system configured to employ a plurality of n concurrently operable frequency sources, each of the frequency sources receiving an input signal for determining when the frequency source will operate in a high current mode, a method for operating said system using offset signal phasing, comprising:
  identifying a reference frequency source from among the plurality of frequency sources, the identified reference frequency source receiving a reference input signal;
  computing phase offsets for each of the remaining input signals supplied to each of the remaining frequency sources; and
  applying the computed phase offsets to the remaining input signals to delay the application of said remaining input signals to the respective frequency sources to ensure a reduction in the peak current consumption by preventing a plurality of the frequency sources from entering into a high current mode of operation substantially concurrently.

21. The method of claim 20, wherein computing phase offsets comprises computing equally space phase offsets for the remaining input signals over a 180 degree phase range.

22. The method of claim 20, wherein computing phase offsets comprises computing equally space phase offsets for the remaining input signals over a phase range defined by the equation:

$$\frac{n-1}{n} \times 360 = \text{phase range}$$

where n is the number of concurrently operating frequency sources.

23. The method of claim 20, wherein applying the computed phase offsets to the respective n−1 remaining input signals comprises passing at least one of the remaining n−1 input signals through a series-cascaded arrangement of inverter elements.

24. The method of claim 23, wherein the series-cascaded arrangement comprises an odd number of inverter elements.

25. The method of claim 24, wherein the reference input signal is supplied to the reference frequency source through a series-cascaded arrangement of an even number of inverter elements comprising one fewer inverter elements than the odd number of inverter elements.

26. The method of claim 23, wherein the number of series-cascaded inverter elements is operable to provide a time delay substantially equivalent to the computed phase offset.

27. A computer program product, resident on a computer readable medium, for operation with a tunable system configured to employ a plurality of n concurrently operable frequency sources, each of the frequency sources receiving an input signal for controlling the frequency source to operate in a high current mode, the computer program product comprising:
  instruction code to identify a reference frequency source from among the plurality of frequency sources, the identified reference frequency source receiving a reference input signal;
  instruction code to compute phase offsets for each of the remaining input signals supplied to each of the remaining frequency sources; and
  instruction code to apply the computed phase offsets to the respective n−1 remaining input signals to ensure a reduction in the peak current consumption by preventing the frequency sources from into a high current mode of operation substantially concurrently.

\* \* \* \* \*